United States Patent
Bazes

(10) Patent No.: US 7,804,341 B2
(45) Date of Patent: Sep. 28, 2010

(54) LEVEL-RESTORED FOR SUPPLY-REGULATED PLL

(75) Inventor: Mel Bazes, Haifa (IL)

(73) Assignee: Marvell Israel (MISL) Ltd., Yokneam (IL)

( * ) Notice: Subject to any disclaimer, the term of this patent is extended or adjusted under 35 U.S.C. 154(b) by 136 days.

(21) Appl. No.: 12/061,373

(22) Filed: Apr. 2, 2008

(65) Prior Publication Data

US 2008/0246525 A1    Oct. 9, 2008

Related U.S. Application Data

(60) Provisional application No. 60/909,804, filed on Apr. 3, 2007.

(51) Int. Cl.
*H03L 7/06* (2006.01)
(52) U.S. Cl. .................. 327/156; 327/147; 327/178
(58) Field of Classification Search ................ None
See application file for complete search history.

(56) References Cited

U.S. PATENT DOCUMENTS

| | | | | |
|---|---|---|---|---|
| 5,821,818 | A * | 10/1998 | Idei et al. | 331/17 |
| 6,317,161 | B1 * | 11/2001 | Renner et al. | 348/536 |
| 6,750,725 | B2 * | 6/2004 | Lee et al. | 331/1 A |
| 6,804,074 | B2 * | 10/2004 | Shoji et al. | 360/51 |
| 6,960,841 | B2 * | 11/2005 | Saitou et al. | 307/10.1 |
| 7,508,281 | B2 * | 3/2009 | Kobata | 331/182 |
| 2004/0155685 | A1 * | 8/2004 | Tatem, Jr. | 327/156 |
| 2005/0175136 | A1 * | 8/2005 | Wu | 375/376 |

OTHER PUBLICATIONS

U.S. Appl. No. 11/726,171, filed Mar. 20, 2007 in the name of Mel Bazes.
Tang et al., "A Novel 8-Phase PLL Design for PWM Scheme in High Speed I/O Circuits," *International SOC Conference, 2006 IEEE*, pp. 119-122, Sep. 2006.
Miki et al., "A new test and characterization scheme for 10+ GHz Low Jitter Wide Band PLL," *Asia and South Pacific Conference on Design Automation 2006*, pp. 24-27, Jan. 2006.

* cited by examiner

*Primary Examiner*—Cassandra Cox

(57) ABSTRACT

The present disclosure provides for a processor that can include digital processing circuitry that receives a digital clock signal from a supply regulated phase locked loop. The supply regulated phase locked loop can include a voltage controlled oscillator that can output an analog signal and a level restorer that can receive the analog signal from the voltage controlled oscillator and can translate the analog output into a digital signal that corresponds to an analog output of the voltage controlled oscillator. The supply regulated phase locked loop can receive an analog input having an input voltage that is within a range of acceptable input voltages. The supply regulated phase locked loop can also be configured to generate the digital output signal, such that the range of acceptable input voltages includes voltage values that are greater than and less than the output voltage.

38 Claims, 8 Drawing Sheets

LEVEL-RESTORED FOR SUPPLY-REGULATED PLL

INCORPORATION BY REFERENCE

This application claims the benefit of U.S. Provisional Application No. 60/909,804, "Level Restorer for Supply-Regulated PLL" filed on Apr. 3, 2007, which is incorporated herein by reference in its entirety.

BACKGROUND

Digital electronic circuits use quantized signals to store and process information reliably. The quantized signals or digital signals can have multi-modal distributions, such as the bimodal distributions that characterize binary digital signals. The process of converting an analog signal to a digital signal may be affected when there is a difference between a mean level of an analog signal and a decision threshold of a quantizer. The process of converting an analog signal to a digital signal may be also affected when the peak-to-peak level of the analog signal is smaller than a quantizer threshold uncertainty or below a desired peak-to-peak digital signal level divided by the quantizer gain.

SUMMARY

The present disclosure provides for a processor that can include digital processing circuitry that receives a digital clock signal from a supply regulated phase locked loop. The supply regulated phase locked loop can include a voltage controlled oscillator that can output an analog signal and a level restorer that can receive the analog signal from the voltage controlled oscillator and can translate the analog output into a digital signal that corresponds to an analog output of the voltage controlled oscillator. The supply regulated phase locked loop can receive an analog input having an input voltage that is within a range of acceptable input voltages. The supply regulated phase locked loop can also be configured to generate the digital output signal, such that the range of acceptable input voltages includes voltage values that are greater than and less than the output voltage.

The present disclosure also provides for a processor that can include a clock source that generates an input clock signal at an input frequency, a forward path portion that can receive the input clock signal and generate a variable amplitude signal that has a clock frequency and is based on the input clock signal. The forward path portion can also generate a level-restored signal that has an amplitude that can be either greater or less than the variable amplitude signal. The processor can also include a level restorer that can convert the variable amplitude signal to the level-restored signal, a feedback path that can return the level-restored signal to the forward path portion, and an output buffer that can generate a clock output signal that has greater power transfer capacity, than the level restorer.

Additionally, the present disclosure provides for a synchronous system that can include a clock source that can generate an input clock signal having an input frequency. The synchronous system can also include a level-restored clock generator having: 1) a forward path portion that can receive the clock signal and can generate a variable amplitude signal having a frequency, 2) a level restorer that can convert the variable amplitude signal to a level-restored signal that can have an amplitude that is either greater or less than the variable amplitude, 3) a feedback path that can feedback the level-restored signal to the forward path portion. The synchronous system can also include a clock distribution unit that can generate a distributed clock signal based on the level-restored signal and multiple processors that can perform digital operations in synchrony with the distributed clock signal.

The present disclosure can also provide for a phase locked loop device that can include a forward path portion that can receive an input clock signal and generate a first signal that has a variable amplitude and a frequency, a level restorer that can convert the first signal to a second signal having a level-restored amplitude that can be either greater or less than the variable amplitude of the first signal, and a feedback path coupled between the level restorer and the input of the forward path portion.

The present disclosure can also provide for a method of synthesizing a digital clock signal. The method can include receiving an input clock signal at an input of a forward path portion of a phase locked loop, generating a first signal having a variable amplitude and a first frequency from the input clock signal, converting the first signal to a second signal having a level-restored amplitude that can be either greater or less than the variable amplitude, and coupling the second signal to the input of the forward path portion.

BRIEF DESCRIPTION OF THE DRAWINGS

The disclosure will make reference to the accompanying figures, wherein like numerals represent like elements, and wherein.

DETAILED DESCRIPTION OF EMBODIMENTS

The present disclosure pertains to digital processing devices and methods that transform an input signal having undetermined or variable signal statistics into a digitally compatible output signal. For example, an input signal received by a circuit domain may have a mean and a peak-to-peak value that varies with a power supply voltage of a generator circuit that produces the input signal. The variable power supply voltage may be regulated by a voltage regulator.

A supply-regulated PLL can include both analog and digital circuits, such as a voltage controlled oscillator (VCO) and a digital divider. The frequency of oscillation of the VCO can be adjusted by varying the voltage of a regulated power supply. The VCO of a supply-regulated PLL, can generate an analog signal for which the mean value and higher order norms or moments, such as peak-to-peak values, vary over a range that may not be compatible with digital circuits coupled to the VCO.

Figure 1:
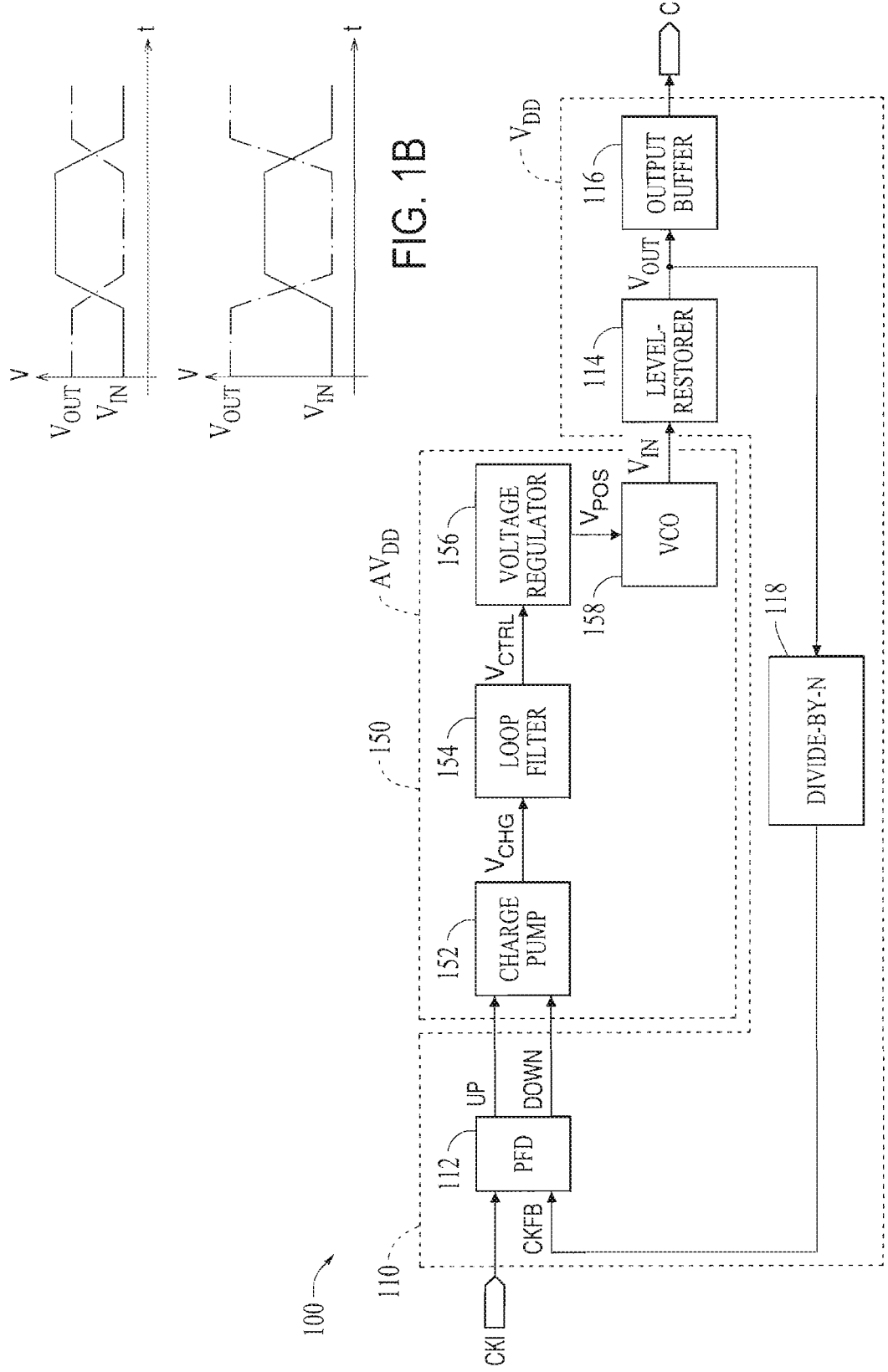
FIG. 1A is an example of a block diagram of a supply-regulated phase locked loop (PLL)
FIG. 1B shows an example of a diagram of input signal and output signal waveforms for the input and output waveforms of a level-restorer.

FIG. 1A is an example of a block diagram of a supply-regulated phase locked loop (PLL) 100. The supply-regulated ILL 100 can synthesize or regenerate a clock signal, synchronize circuits or networks, generate a frequency reference or system clock, or generate a clock for a digital circuit such as a microprocessor, network processor, a synchronous system, and the like. The circuitry, in the supply-regulated PLL can be partitioned into a digital domain 110 and an analog domain 150. Circuitry in the digital domain 110 can be powered by a core digital voltage supply denoted $V_{DD}$. The analog domain 150 circuits can be powered by an analog supply voltage denoted $AV_{DD}$. The $AV_{DD}$ voltage can be larger or smaller than $V_{DD}$. For example, $AV_{DD}$ can be 1.8 Volts (V) and $V_{DD}$ can be 1.0 V.

The digital domain 110 can include a phase/frequency detector (PFD) 112, a level restorer 114, an output buffer 116, and a divide-by-N 118 circuit.

The analog domain 150 can include a charge pump 152, loop filter 154, voltage regulator 156, and a VCO 158. The PFD 112 in the digital domain 110 can couple UP and DOWN signals to the charge pump 152. The charge pump 152 can couple a loop or phase error signal, $V_{CHG}$, to the loop filter 154.

The analog domain 150 circuits can interface to the digital domain 110 circuits at one or more locations, such as: 1) at the input to the charge pump; and 2) at the output from the VCO. Interface circuits, such as level restorer 114 and the charge pump 152 can translate the output signal levels from one domain into input signal levels that are appropriate to the receiving domain. For example, the high-speed, reduced output swing, self-biased, fully complementary CMOS comparator, disclosed in U.S. application Ser. No. 11/726,171 can translate digital input signals into signals appropriate for driving current switches. The high-speed comparator can be included in the charge pump 152, for example.

The charge pump 152 can include switchable current sources and current sinks that direct charge to an integrator. The charge pump 152 can include an integrator, such as a capacitor or other circuit elements, that can convert the accumulated charge to a voltage, $V_{CHG}$. The $V_{CHG}$ signal can be described as an unfiltered voltage control signal. The $V_{CHG}$ signal can include a DC component that corresponds to a steady-state frequency of the VCO 158. The $V_{CHG}$ signal can also include a transient component when the PFD 112 detects a phase error.

The loop filter 154 can filter or shape the spectrum of the unfiltered voltage control signal $V_{CHG}$. The spectral shaping properties of the loop filter 152 can determine the PLL loop bandwidth, damping factor, and PLL performance characteristics including acquisition and tracking performance. The filtered or spectrally shaped voltage control signal, $V_{CTRL}$, can command the voltage regulator 156 to generate a regulated power supply voltage, $V_{POS}$.

The loop filter 154 can couple the filtered voltage control signal, $V_{CTRL}$ to the voltage regulator 156, which can couple a regulated supply voltage, $V_{POS}$, to the VCO 158.

The voltage regulator 156 can amplify or buffer the filtered voltage control signal $V_{CTRL}$ and can generate a variable or adjustable regulated power supply voltage. The input to output characteristic of the voltage regulator 156 can be a strictly linear, affine, or nonlinear monotonic function. The $V_{POS}$ voltage from the voltage regulator 156 can cause the VCO 158 to vary in frequency, DC level, and peak-to-peak amplitude of the VCO 158 analog oscillatory signal. $V_{IN}$. When these quantities vary simultaneously both the DC level and the peak-to-peak level of the VCO 158 signal $V_{IN}$ can be monotonically related to the fundamental frequency.

The VCO 158 can couple an analog oscillatory signal to the level restorer 114 in the digital domain 110. The analog oscillatory signal can be described as an intra-loop input signal that is an input, $V_{IN}$, to the level restorer 114. The level restorer 114 can couple a level-restored signal, $V_{OUT}$, to the output buffer 116 and the divide-by-N 118 circuit. The divide-by-N 118 circuit can couple an oscillatory feedback signal to the PFD 112 in the digital domain 110.

The VCO 158 can generate a variable frequency analog oscillatory signal, $V_{IN}$, that may be denoted as CKVCO, and can couple the analog oscillatory signal to the level restorer 114 in the digital domain 110. Due to control by $V_{POS}$, the VCO 158 may exhibit a monotonic relationship between the DC component of the filtered voltage control signal, $V_{CTRL}$, the fundamental frequency and both the DC and peak-to-peak levels of the analog oscillatory signal, $V_{IN}$.

When the supply-regulated PLL 100 loop is closed as shown in FIG. 1A, $V_{POS}$ can be a function of VCO frequency, the process corner, temperature, and other factors. Due to these and possible other factors. $V_{POS}$ and consequently the amplitude of the VCO 158 signal $V_{IN}$, may be greater than, equal to, or lower than the core digital supply voltage $V_{DD}$. The level restorer 114 can accept the varying $V_{IN}$ or CKVCO signal and generate a level-restored signal, $V_{OUT}$, that is compatible with the output buffer 116 and divide-by-N 118 circuit inputs in the digital domain 110.

The digital domain 110 can accept both the analog oscillatory signal $V_{IN}$ and a clock input signal CKI from a clock source (not shown) and can generate a clock output signal or phase locked output signal CKO. The frequency of CKO can be N times higher than CKI when the output buffer 116 does not include a divider. When the output buffer 116 includes a divide-by-K divider, then the frequency of CKO can be N/K times the frequency of CKI.

The digital domain 110's level restorer 114 can couple a feedback signal to both the output buffer 116 and the divide-by-N 118 circuit. The level restorer 114 can transform analog domain 150 signals between ground and $V_{POS}$ to digital domain 110 signals between ground and $V_{DD}$.

The level restorer 114 can form a sum of a balance level and the AC portion of the analog oscillatory signal $V_{IN}$ from the VCO 158. The balance level can be generated by a feedback network included in the level restorer 114. The feedback network may be a self-balancing network that adds a portion of the difference in the input and output of the feedback network to the analog oscillatory signal. For example, the feedback network can generate the balance level using negative feedback. The feedback network can include a single ended inverting amplifier and a feedback resistor in parallel with the input and output of the inverting amplifier, as described with respect to FIG. 2 and FIG. 3. The feedback network can also include a differential amplifier and feedback elements, as described with respect to FIG. 4.

The single ended or differential summed signal at the input to the feedback network can be compared with a threshold of the feedback network. The threshold can be a voltage level that may approximately equal the balance level. The threshold can be a constant and the level restorer can act as a hysteresis-free quantizer or hard-limiter that converts an input signal into a bimodally distributed output signal. The threshold level can be dependent on a prior state of the level restorer 114 so that the input to output characteristic of level restorer 114 exhibits hysteresis. The level restorer 114 can exhibit soft limiting characteristics, such as compander characteristics or saturating nonlinear characteristics that are anti-symmetric around the threshold. The level restorer 114 may exhibit both state dependent and either soft-limiting or hard-limiting characteristics.

The divide-by-N 118 circuit can couple an oscillatory feedback signal to the PFD 110. The PFD 110 can close the loop by supplying UP and DOWN signals to the input of the charge pump 152 in the analog domain 150.

The digital domain 110 can accept the CKI digital clock signal at PFD 112, which can be described as a digital processing circuit that compares the phase and frequency of the digital clock signal CKI to the phase and frequency of an oscillatory feedback signal CKFB. The oscillatory feedback signal CKFB can be generated by the divide-by-N 118 circuit in response to the level restorer's 114 output signal $V_{OUT}$. The UP and DOWN signals from the PFD 112 can close the feedback loop of the supply-regulated PLL 100 by generating a phase error signal $V_{CHG}$ at the output of charge pump 152.

The charge pump 152 can include a high-speed reduced-output-swing comparator that receives UP and DOWN signals from the PFD 152. The UP and DOWN logic signals can be translated to switching signals that control current flow in the charge pump 152.

The charge pump 152 can source or sink current, according to the UP and DOWN signals, and the loop filter 154 can filter the charge pump 152 signal to implement desired PLL performance characteristics.

The performance of supply-regulated PLL, 100 can be quantified with both acquisition and tracking performance metrics such as: acquisition time, hang-up time, cycle-slip probability, mean time to cycle slip, pull-in range, hold-in range, overshoot, and phase jitter or phase-noise of the analog oscillatory signal from the VCO 158, etc. The performance metrics can be functions of loop bandwidth, loop gain, damping factor, and other factors.

The performance of the supply-regulated PLL 100 can improve when the level restorer 114 is included. The level restorer 114 can stabilize or reduce the variation in the peak-to-peak amplitude of the analog oscillatory signal or intra-loop signal $V_{IN}$ from the VCO 158, the loop gain, and the phase noise exhibited by the supply-regulated PLL 100. The level restorer 114 can stabilize the loop damping factor and improve transient response time, reduce phase overshoot and undershoot, and other performance metrics.

The PLL performance metrics can depend on extrinsic noise factors, such as the amplitude and phase noise of the input signal, CKI. The PLL performance metrics may also be dependent on intrinsic noise factors, such as common mode noise on the power supply voltages, $V_{DD}$ and $AV_{DD}$, mutual inductance between circuit elements, parasitic capacitances and inductances, shot noise, and the like.

For example, power-supply noise can affect the instantaneous frequency of the VCO 158. Since frequency is the first time derivative of phase, instantaneous frequency changes accelerate or decelerate the phase trajectory of the output clock signal, CKO. Power supply noise can generate phase noise in one or more of the following signals: 1) the CKO signal, 2) the analog oscillatory signal or intra-loop signal $V_{IN}$ from the VCO 158, 3) the oscillatory output signal $V_{OUT}$ from the level restorer 114, or the 4) the oscillatory feedback signal CKFB from the divide-by-N 118 circuit.

FIG. 1B shows an example of a diagram of the input signal and output signal waveforms of a level-restorer, such as level-restorer 114, in which the $V_{IN}$ waveform amplitude may be larger or smaller than the $V_{OUT}$ waveform amplitude. For example, the peak-to-peak voltage of the input signal may exceed the peak-to-peak voltage of the output signal or vice versa. In other words, a bimodally distributed output signal $V_{OUT}$ can be generated from a bimodally distributed input signal $V_{IN}$, regardless of which signal has the larger amplitude.

Figure 2:
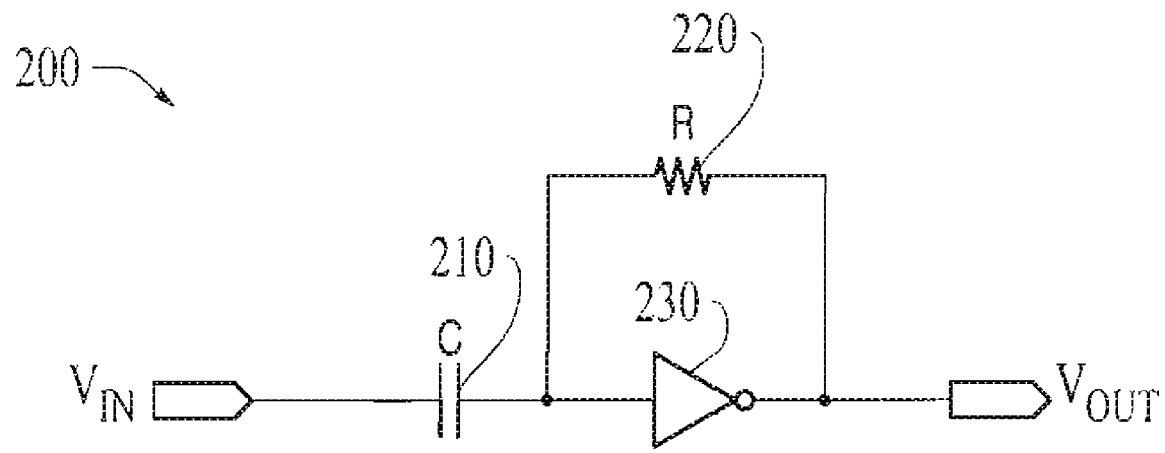
FIG. 2 shows an example of a single-ended level restorer circuit that can accept an input signal from an analog domain and generate an output signal for a digital domain.

FIG. 2 shows an example of a single-ended level restorer circuit 200 that can accept an input signal, denoted $V_{IN}$, from an analog domain, such as analog domain 150, and can generate a level-restored signal, denoted $V_{OUT}$, for a digital domain, such as digital domain 110. The single-ended level restorer circuit 200 can include a coupling capacitor 210, a feedback resistor 22-0, and an inverter 230. Together, the feedback resistor 220 and the inverter 230 can be described as a feedback network.

The single-ended level restorer circuit 200 input signal can be received at coupling capacitor 210. The coupling capacitor 210 can couple the input signal to both the feedback resistor 220 and the inverter 230. The inverter 230 can couple the output signal to the feedback resistor 220, through which a feedback signal can be coupled to the input of inverter 230.

The single-ended level restorer circuit 200's input signal $V_{IN}$ can be characterized as having a direct-current (DC) level and an alternating current (AC) signal component having a peak-to-peak amplitude. The input signal can be generated by an analog domain source, such as the VCO 158. The coupling capacitor 210 can transfer only the AC signal to the inverter 230 input. The AC signal can be combined with DC level from the feedback resistor 220 to generate an inverter input signal with a DC level near or at the trip-point of the inverter 230.

The coupling capacitor 210 can block the DC portion of the input signal and can pass the AC portion. The AC portion of the input signal can include frequencies above DC. The coupling capacitor 210 can, together with the feedback resistor 220, form a summing network that sums a balance level and the AC portion.

The coupling capacitor 210 can exhibit a small impedance in comparison with the impedance of the feedback resistor 220 at the frequency of $V_{IN}$. In other words, a series combination of 1) the coupling capacitor 210 and 2) the feedback resistor 220 can exhibit a high pass filter characteristic that cuts off frequencies that are less than the fundamental frequency of $V_{IN}$.

The inverter 230 can be powered by the core digital supply voltage $V_{DD}$. The peak-to-peak amplitude of the inverter 230 output may approximately equal $V_{DD}$. The inverter 230 can have a voltage gain, $A_{INV}$, that can invert the summed signal and may be greater or less than unity in magnitude. In other words, the inverter 230 can arithmetically invert and amplify, or attenuate the input signal. The inverter 230 can also shape the transformation of input to output using a nonlinear transformation, such as a saturating non-linearity. The saturating non-linearity can be a binary quantizer that generates a bimodally distributed, level-restored signal, $V_{OUT}$, from an input signal, $V_{IN}$, including bimodally distributed input signals.

The feedback resistor 220 can cause the inverter 230 to be biased at a threshold voltage, $V_{THRESHOLD}$. The threshold voltage can be a voltage level for which the inverter 230 input and output are approximately equal The inverter 230 can generate an output signal with a peak-to-peak amplitude of approximately $V_{DD}$ as long as the amplitude of the AC component of the input signal equals or exceeds $V_{DD}/A_{INV}$.

Figure 3:
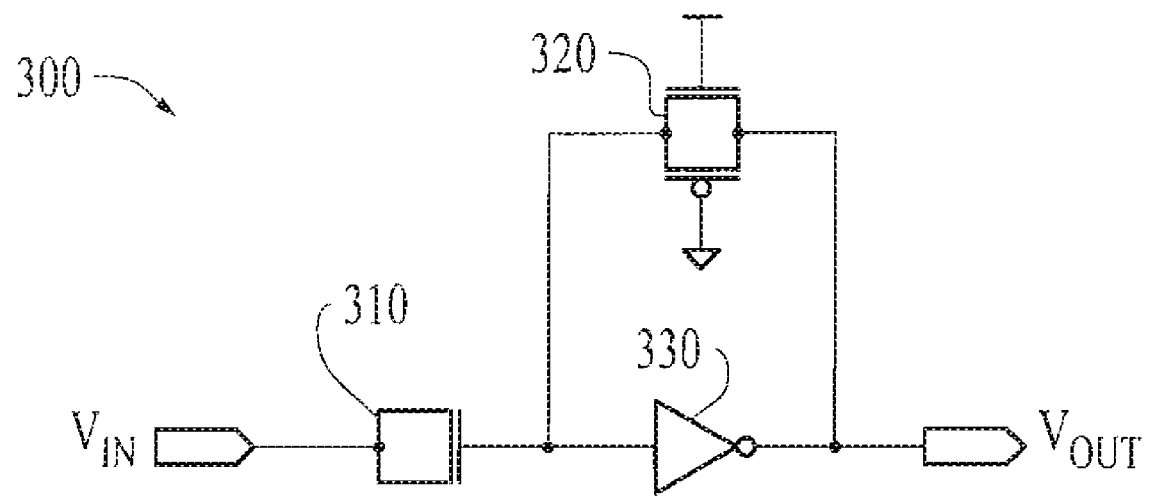
FIG. 3 shows an example of a CMOS single-ended level restorer that can include a coupling capacitor, a feedback element, and an inverter.

FIG. 3 shows an example of a CMOS single-ended level restorer 300 that can include a coupling capacitor 310, a feedback element 320, and an inverter 330. The coupling capacitor 310 can couple the input signal, $V_{IN}$, to both the feedback element 320 and the inverter 330. The inverter 330 can couple the level-restored signal, $V_{OUT}$, to the feedback element 320, through which a feedback signal can be coupled to the input of inverter 330.

The coupling capacitor 310 can include, for example, an N-channel or P-channel metal oxide semiconductor field effect transistor (MOSFET) for which the source and drain are both connected to the level restorer 300 input and the gate is connected to the inverter 330 input or vice versa. In accordance with an embodiment of the disclosure, the coupling capacitor 310 may be advantageously designed and constructed so the MOSFET threshold voltage can be significantly less that the peak level of the analog signal at the input to the level restorer. The coupling capacitor 310 can implement a DC blocking capacitor such as coupling capacitor 210.

The feedback element 320 can be constructed using N-channel and P-channel MOSFETs with common source connections and common drain connections. The gate of the N-channel MOSFET can be connected to $V_{DD}$ and the gate of the P-channel MOSFET can be connected to ground. The ground connection can advantageously be chosen to be a digital ground, power supply return line or ground-plane. The power and ground connections of feedback element 320 can bias the transistors in a triode region so that the feedback element 320 acts as a feedback resistor, such as feedback resistor 220.

Figure 4:
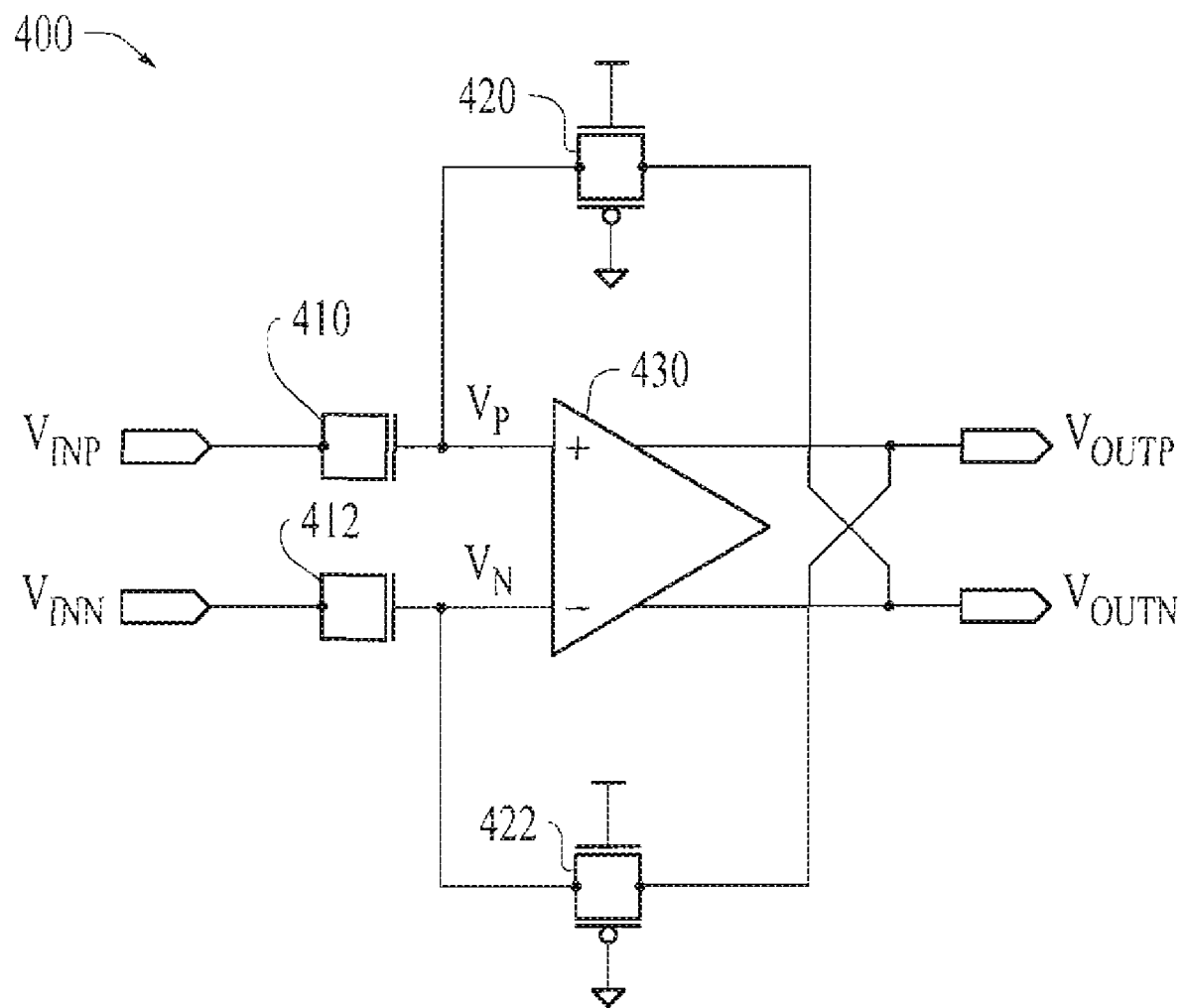
FIG. 4 shows an example of a CMOS differential level restorer that can include a non-inverting coupling capacitor, and inverting coupling capacitors a first feedback element, a second feedback element, and a differential amplifier.

FIG. 4 shows an example of a CMOS differential level restorer 400 that can include a first coupling capacitor 410 receiving a positive voltage input, and a second coupling capacitor 412 receiving a negative voltage input, a first feedback element 420, a second feedback element 422, and a differential amplifier 430. The first coupling capacitor 410 can couple an input signal, denoted $V_{INP}$, to a positive terminal $V_P$ of the differential amplifier 430 and from node $V_P$ to feedback element 420, which provides feedback from $V_{OUTN}$. The second coupling capacitor 412 can couple an input signal, denoted $V_{INN}$, to a negative terminal $V_N$ of the differential amplifier 430 and from node $V_N$ to feed back element 422, which provides feedback from $V_{OUTP}$. The differential amplifier 430 can thus generate a level-restored, differentially amplified signal between a positive and a negative output terminal.

The level-restored, differentially amplified signal from differential amplifier 430 can be the difference between the signal at the positive output terminal, $V_{OUTP}$, and the negative output terminal, $V_{OUTN}$. The differential level restorer 400 can translate differential analog levels $V_{INP}$ and $V_{INN}$ to differential digital levels $V_{OUTP}$ and $V_{OUTN}$. Differential circuits, such as differential level restorer 400, can improve the immunity of a system, such as supply-regulated PLL 100, to common mode noise, for example.

Figure 5:
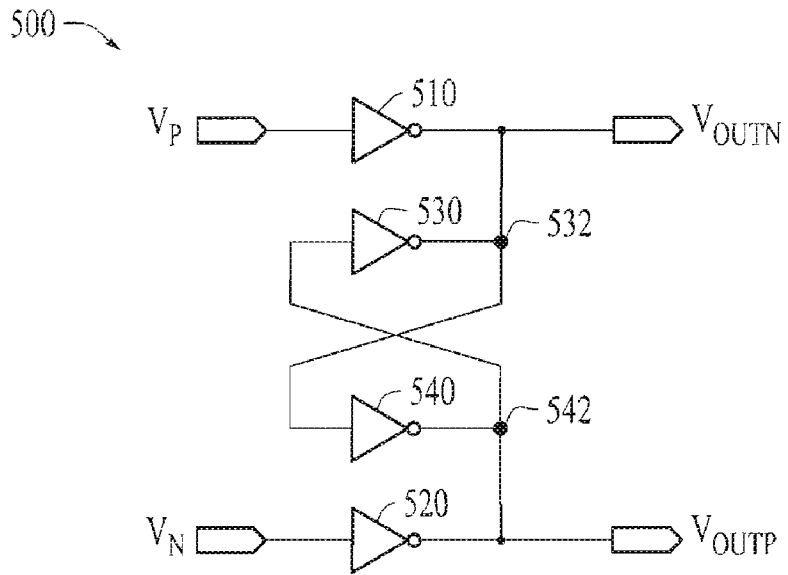
FIG. 5 shows an example of a differential amplifier that can include outer amplifiers and inner amplifiers.

FIG. 5 shows an example of a differential amplifier 500 that can include a first outer amplifier 510, a second outer amplifier 520, a first inner amplifier 530, and a second inner amplifier 540. The differential amplifier 500 can implement a differential amplifier such as differential amplifier 430.

The first outer amplifier 510 can amplify an input signal $V_P$ and can generate an output signal $V_{OUTN}$. The output of the first outer amplifier 510 can drive an input of the second inner amplifier 540. The output of the second inner amplifier 540 can drive an input of the first inner amplifier 530. The output of the first inner amplifier 530 can combine with the output of the first outer amplifier 510 to form the output signal $V_{OUTN}$. The output of the first inner amplifier 530 and the second inner amplifier 540 may be presented on a first junction 53) and a second junction 542, respectively. The first junction 532 and the second junction 542 may provide connection points to the differential amplifier 500 using solder ball technology, for example.

The second outer amplifier 520 can amplify an input signal $V_N$ and cat generate an output signal $V_{OUTP}$. The output of the second outer amplifier 520 can drive the input of the first inner amplifier 530. The output of the first inner amplifier 530 can drive an input of the second inner amplifier 540. The output of the second inner amplifier 540 can combine with the output of the second outer amplifier 520 to form the output signal $V_{OUTP}$.

The combined effect of the first and second inner amplifiers 530 and 540 can be amplification and subtraction of the $V_N$ and $V_P$ from $V_{OUTN}$ and $V_{OUTP}$, respectively. In other words, the differential amplifier 500 can operate as a cross-coupled amplifier in which the input terminal signals are amplified, then cross-coupled and subtracted rather than subtracted then amplified.

Figure 6:
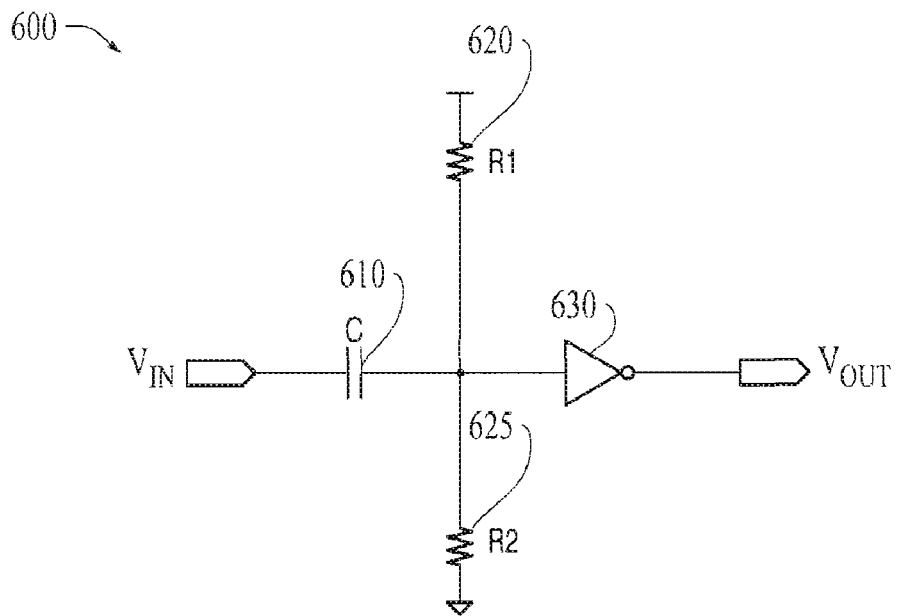
FIG. 6 shows an example of a feed-forward level restorer that can include a coupling capacitor, resistors, and an inverter.

FIG. 6 shows an example of a feed-forward level restorer 600 that can include a coupling capacitor 610 (C), a resistor 620 (R1), a resistor 625 (R2), and an inverter 630. The coupling capacitor 610 can couple an analog input signal, denoted $V_{IN}$, to a common node of the inverter 630, the resistor 620, and the resistor 625.

The resistors 620 and 625 can be integrated resistors, discrete resistors, MOSFET devices configured to operated in the triode region, a resistive ladder from an digital to analog converter (DAC), and the like.

A terminal of resistor 620 can connect to a digital power supply line $V_{DD}$ and a terminal of resistor 625 can connect to a digital ground line. The resistor 620 can be implemented, for example, by a P-channel MOSFET with a source terminal connected to $V_{DD}$ and both the gate and the drain connected together but separate from the source terminal. The resistor 625 can be implemented, for example, by an N-channel MOSFET with a source terminal connected to ground and both the gate and the drain connected together but separate from the source terminal.

The inverter 630 can invert a summed balance level and an AC signal coupled from coupling capacitor 610. The inverter 630 input terminal can be biased to a voltage determined by the impedances of the resistor 620, resistor 625, and the input impedance of inverter 630.

The feed-forward level restorer 600 balance level may be a fixed value determined by $V_{DD}$, a fixed resistor 620 (R1), and a fixed resistor 625 (R2). The feed-forward level restorer 600 balance level may be an adjustable value when resistor 620 or resistor 625 is adjusted. For example, the resistor 620 (R1) or resistor 625 may be resistive ladders included in a digital-to-analog converter (DAC).

Figure 7:
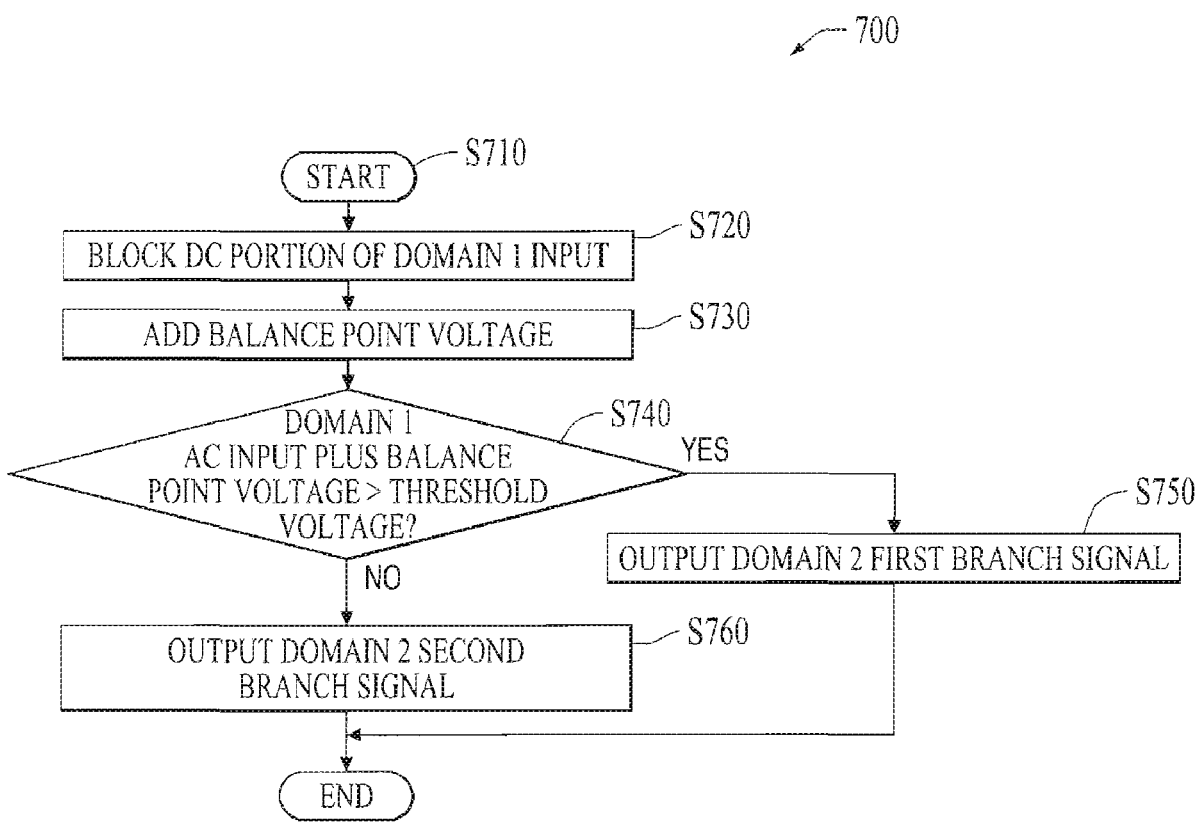
FIG. 7 shows a diagram of a flowchart outlining an exemplary process for accepting an input signal from a first domain and generating an output signal in a second domain.

FIG. 7 shows a diagram of a flowchart 700 outlining an exemplary process for accepting an input signal from a first domain and generating an output signal in a second domain. The first and second domain signals can each include a DC and an AC portion. The AC portion of the input signal can include signals with frequencies generated by an oscillator. For example, the AC portion of the domain 1 signal can include a variable frequency analog oscillatory signal CKVCO from the VCO 158. The CKVCO signal may be denoted $V_{IN}$ to convey the sense of being an input to a level-restoring element, such as level-restorer 114, as noted with respect to FIG. 1A.

The flowchart 700 can start at step S710 and can proceed to step S720 in which a DC portion of the signal from the first domain, denoted domain 1, can be blocked. The DC portion of the first domain signal can be blocked by a capacitor, a subtractor, a digital signal processor that includes an analog; to digital converter (ADC) and DAC, and the like. For example, the DC portion of the first domain signal can be blocked by a coupling capacitor, such as coupling capacitor 210, 310, 410, 412, 610, and the like.

Program flow can proceed from step S720 to step S730 in which a balance point voltage can be added to the AC portion of the input signal. The balance point voltage can be a single ended or differential signal. For example, a single ended balance point voltage can be determined by a feedback network, such as resistor 220 and inverter 230, or feedback element 320 and inverter 330. A differential balance point voltage can be a difference of an inverted, cross-coupled output signal, such as $V_{OUTP}$ and $V_{OUTN}$ from differential amplifier 430'. The $V_{OUTP}$ and $V_{OUTN}$ signals from differential amplifier 430 can cross-couple through feedback elements 422 and 420, respectively to add the balance point voltage to the AC portion of the input signal voltage difference across the input terminals of differential amplifier 430.

From program step S730, the program can flow to step S740, in which the summed signal, i.e., the AC portion of the domain 1 signal and the balance point voltage, can be compared with a threshold voltage. The trip point voltage and balance point voltage may be equal or unequal. The threshold comparison can quantize the summed signal into two levels according to the branches taken in step S740. The two levels can be lower or higher in magnitude than the magnitude of the input signal. An inverter or an amplifier, such as inverter 230 or differential amplifier 430, can amplify or attenuate the quantized summered domain 1 AC signal and balance point voltage relative to the summed signal at the inverter 230 or differential amplifier 430 input, respectively.

When the summed signal is greater than the threshold level, then program flow can proceed to step S750, otherwise program flow can proceed to step S760. The comparison operation of step S740 can divide the transformation of the domain 1 signal to the domain 2 signal input two regions according to the program flow branch taken after the comparison. For example, the transformation may be a binary quantization, a linear transformation about a centroid, an affine transformation, a nonlinear transformation, such as a companding transformation, or any other suitable transformation.

When program flow proceeds to step S750, then the summed signal can be transformed into a domain 2 signal by using a first linear or first nonlinear function. When program flow proceeds to step S760, then the summed signal can be transformed into a domain 2 signal using second linear or second nonlinear function. The first and second functions can be called branches of the transformation. The functions can be contentious or discontinuous at the threshold voltage. The functions can be monotonic or non-monotonic. The functions can be advantageously chosen to compound the summed signal using a signed logarithmic saturating non-linearity, a power function, an A-law, or a μ-law compander, and the like. The functions can also be advantageously chosen to be discontinuous at the threshold voltage and generate different but constant values for sum signals above and below the threshold voltage. In other words, the two branches can produce a domain 2 signal that is quantized into the two states of a bimodal distribution.

Figure 8:
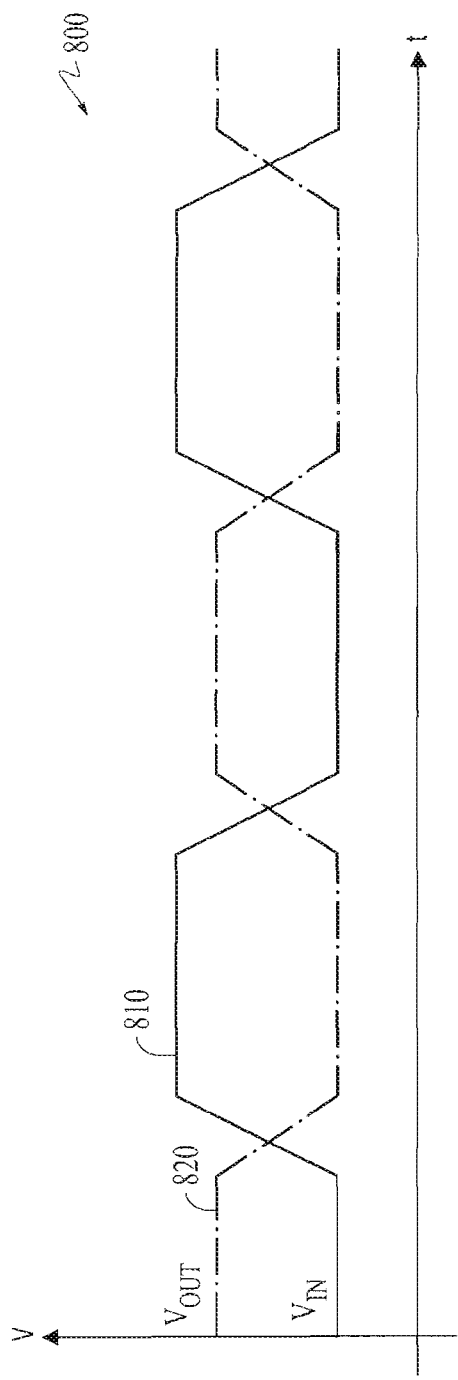
FIG. 8 shows an example of a diagram of input signal and output signal waveforms.
Figure 9:
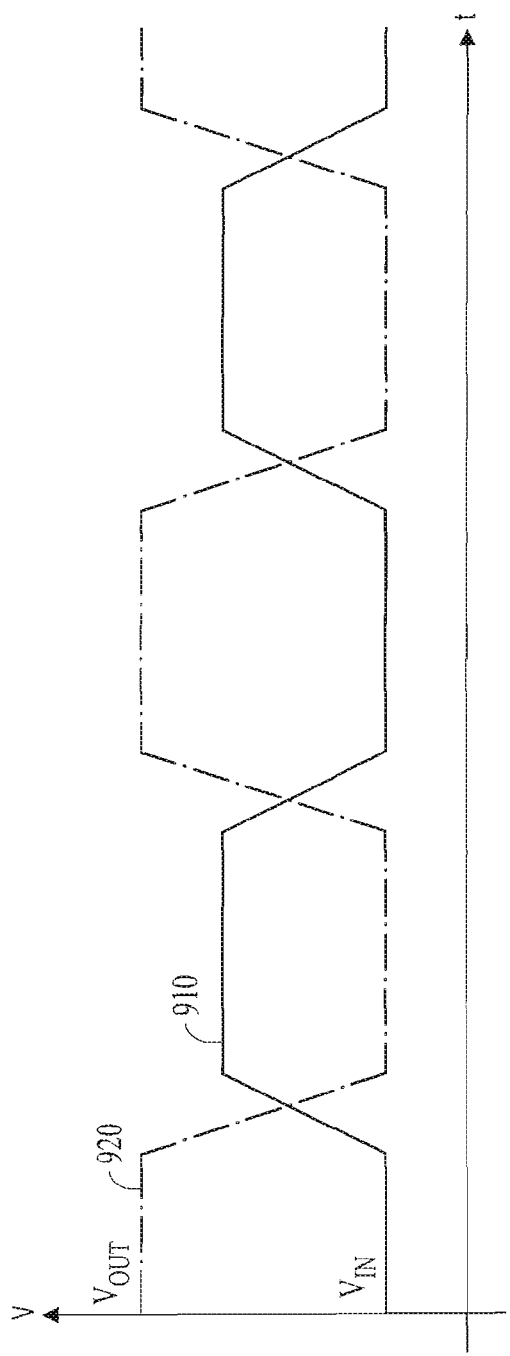
FIG. 9 shows an example of a diagram of input signal and output signal waveforms.

FIG. 8 shows an example of a diagram of input signal $V_{IN}$ 810 and output signal $V_{OUT}$ 820 waveforms 800 in which the peak input signal exceeds the peak output signal. FIG. 9 shows an example of a diagram 900 of input signal $V_{IN}$ 910 and output signal $V_{OUT}$ 920 waveforms 900 in which the peak output signal exceeds the peak input signal. Both FIGS. 8 and 9 show that a bimodally distributed output signal $V_{OUT}$ can be generated from a bimodally distributed input signal $V_{IN}$. Using the devices and methods of the present disclosure, the mean or DC level and the peak-to-peak value of an input signal, such as the $V_{IN}$ 810 or 910, can vary above or below the mean and the peak-to-peak value of the output signal $V_{OUT}$ 820 or 920, respectively.

The disclosed level restored, supply-regulated PLL may be embodied in a processor, such as a micro-processor, a chip, such as a hybrid analog-digital chip, an application specific integrated circuit (ASIC), a clock generator, and the like. The disclosed level restored supply-regulated PLL structure may be embodied in a single processor, a synchronous system that includes processors, a network of devices that communicate digitally, a network of devices that use a system clock, and the like. The level-restored PLL can generate a system clock that is distributed or broadcast to multiple processors. Each processor may also include an instance of the level-restored, supply-regulated PLL to track the distributed clock and generate local replicas of the distributed clock for synchronous operation of the processors. For example, a network of processors or communications devices that receive a distributed system clock can include multiple level restored supply-regulated PLLs that synchronize each processor or device to the system clock.

Figure 10:
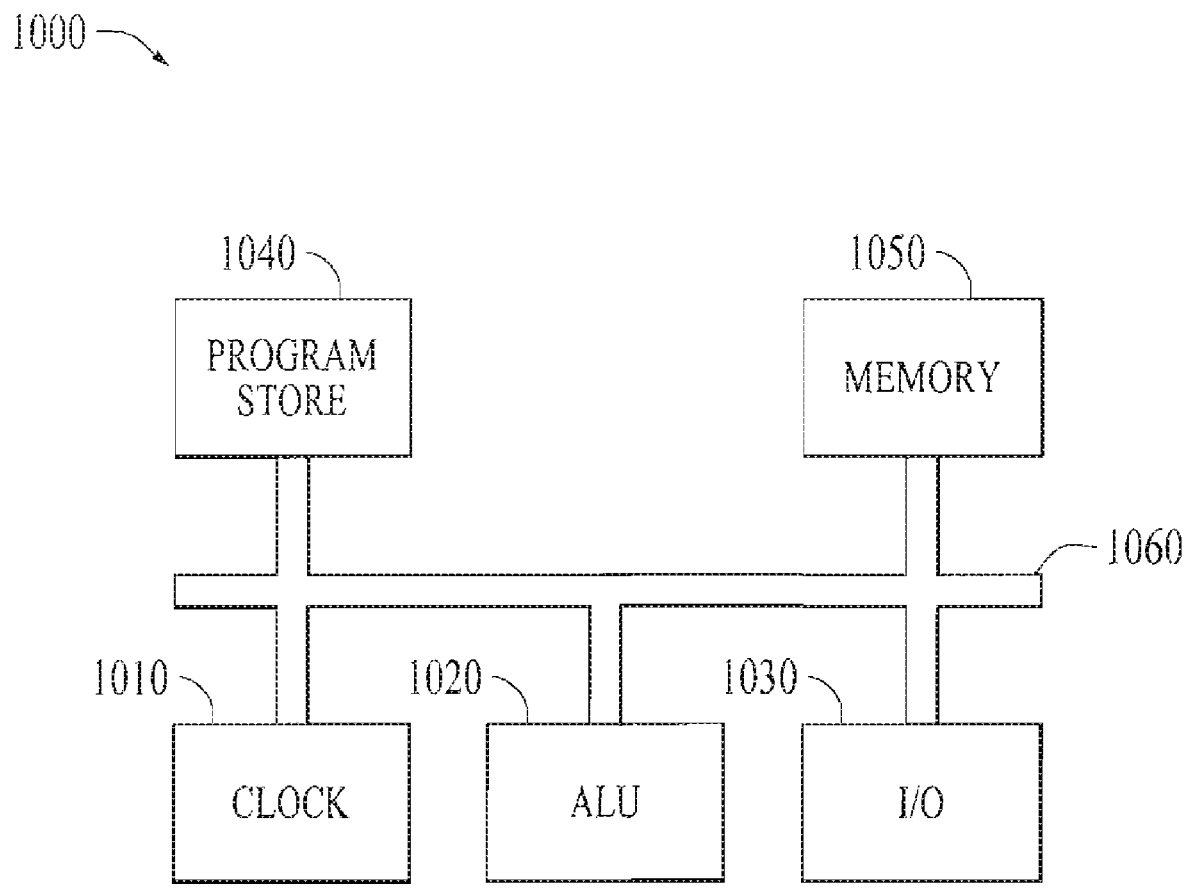
FIG. 10 shows an example of a processor.

FIG. 10 shows an example of a processor 1000 that can include a level-restored clock generator 1010, an arithmetic-logic unit (ALU) 1020, an input-output system (I/O) 1030, a program store 1040, a memory 1050 and a bus 1060. The level-restored clock generator 1010 can be a supply-regulated PLL, such as supply-regulated PLL 100. The level-restored clock generator 1010 can provide a fixed or variable frequency clock signal to the elements of processor 1000. The level-restored clock generator 1010 can include a digital clock signal source such as a quartz crystal, an quartz crystal oscillator module, a high quality-factor (Q) resonator, a regenerator or receiver that receives a distributed master clock signal and the like. The level-restored clock generator 1010 can internally divide a digital feedback signal or $V_{OUT}$ signal by unity or by a division factor N.

The elements of processor 1000 can communicate over a bus 1060 that can couple each element to each other element. For example, the clock signals from level-restored clock generator 1101 can be coupled to each element of processor 1000. Typical processor operations can include retrieving an instruction from program store 1040, executing the instruction in ALU 1020 storing a result in memory 1050, outputting a result to I/O 1030, and the like. The level-restored clock generator 1010 can provide synchronous operations to each operation of processor 1000. For example, ALU 1020 may operate at 3 GHz, bus transfers may occur on bus 1060 at a submultiple of 3 &Hz, such as program fetches from program store 1040 or program storage or retrieval from memory 1050, and the like. In other words, level-restored clock generator 1010 may generate multiple clocks, such as phase-aligned clocks at multiple frequencies. The multiple frequency clocks may be generated by clock dividers, such as the output of divide-by-N 118, in addition to clock signals provided at the input of divide-by-N 118 circuit, or by external frequency dividers and the like.

Figure 11:
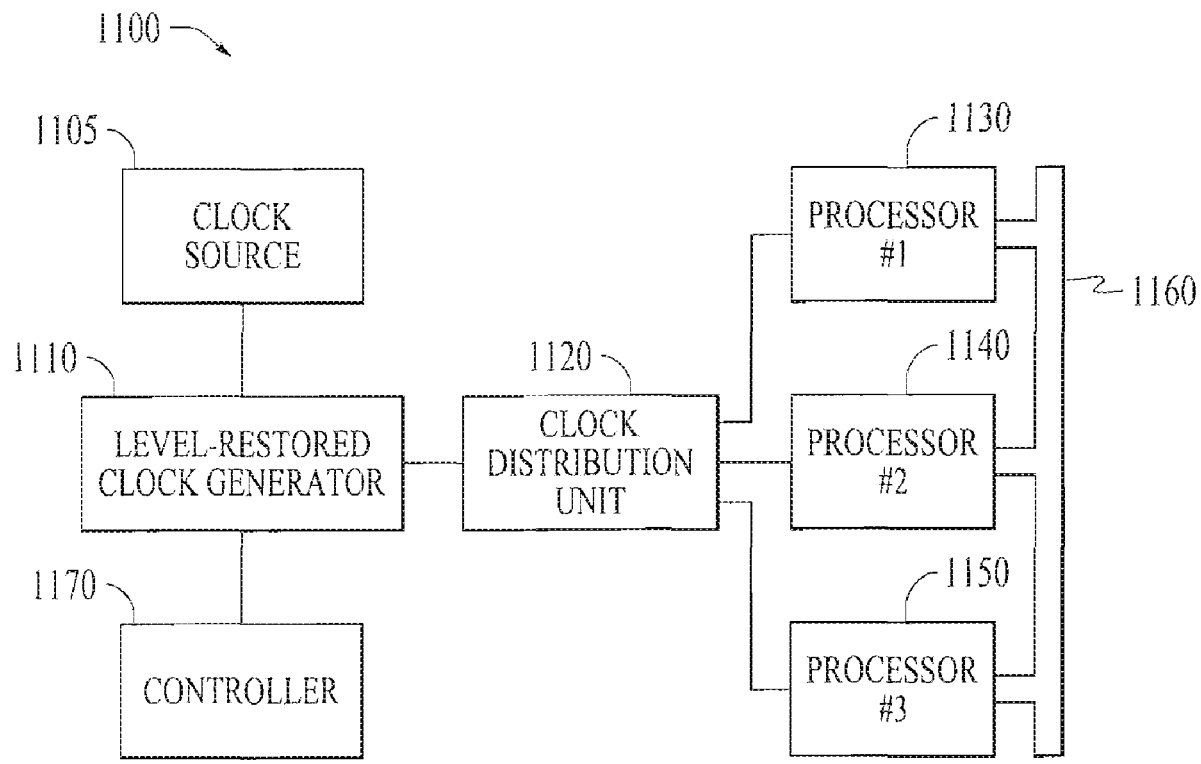
FIG. 11 shows an example of a synchronous system.

FIG. 11 shows an example of a synchronous system 11000 that can include a clock source 1105, a level-restored clock generator 1110, a clock distribution unit 1120, a first processor 1130, a second processor 1140, a third processor 1150, a bus 1160, and a controller 1170. The clock source 1105 and controller 1170 can couple to the level-restored clock generator 1110. The clock source 1105 can be a source, such as a quartz crystal, a quartz crystal oscillator module, a high quality-factor (Oh resonator, a regenerator or receiver that receives a distributed master clock signal and the like. The controller 1170 may be a master controller that synchronizes system or network operations.

The level-restored clock generator 1110 can couple to the clock distribution unit 1020, which can couple to the first, second and third processors 1130-1150, respectively. The bus 1160 can couple the first, second and third processors 1130-1150. In other words, inter-processor communication can occur on bus 1160.

The level-restored clock generator 1110 can drive the clock distribution unit 1120 with a master clock signal. For example, the level-restored clock generator 1110 can drive the clock distribution unit 1120 with a single frequency signal. The frequency of the level-restored clock generator 1110 output signal can be adjusted or programmed by a controller 1170 coupled to the level-restored clock generator 1110.

The clock distribution unit 1120 can be a buffer, power amplifier, clock divider, and the like or a set of such elements. The clock distribution unit 1120 can generate multiple output clock signals to drive processors 1130-1150. The distributed clock signals can be buffered replicas of the level-restored clock generator 1110 signal, frequency divided replicas, polyphase clock signals that are staggered in phase, and the like. For example, the clock distribution unit 1120 can distribute clock signals to physically separated processors such that propagation delays to each processor are accommodated for by phase adjustments of the clock distribution unit 1120 output signals. In other words, the distributed clock signals can be phase-adjusted so that synchronous operation of processors 1130-1150 can occur over the bus 1160.

The processors 1130-1150 can include controllers, microprocessors, arithmetic-logic units, ASIC, synchronous circuits, and the like. For example, processor 1130 may be controller chip with a microprocessor core, the processor 1140 may be a digital circuit, the processor 1150 may be a storage unit, such as a hard disk drive, and the like. In another example, the processors 1130-1150 may be substantially similar computational engines in a multi-core computer.

While the invention has been described in conjunction with the specific embodiments thereof, it is evident that many alternatives, modifications, and variations will be apparent to those skilled in the art. Accordingly, embodiments of the invention as set forth herein are intended to be illustrative, not limiting. There are changes that may be made without departing from the spirit and scope of the invention.

What is claimed is:

1. A processor, comprising:
   a clock source that is configured to generate an input clock signal having an input frequency;
   a forward path portion that is configured to receive the input clock signal at a first input and generate a first signal having a variable amplitude and a first frequency, the first signal being based on the input clock signal;
   a level restorer, coupled to an output of the forward path portion, that is configured to convert the first signal to a second signal having the first frequency and a level-restored amplitude that can be a value that is either greater or less than the variable amplitude of the first signal;
   a feedback path, coupled between the level restorer and a second input of the forward path portion, that is configured to return the second signal to the forward path portion, and that includes a divide-by-N circuit that dives the first frequency by a predetermined frequency divisor; and
   an output buffer, coupled to the level restorer, that is configured to generate a clock output signal having greater power transfer capacity than the level restorer.

2. A synchronous system, comprising:
   a clock source that is configured to generate an input clock signal having an input frequency;
   a level-restored clock generator, coupled to the input clock source, comprising:
      a forward path portion that receives the clock signal at a first input and outputs a first signal having a variable amplitude and a first frequency, the first signal being based on the input clock signal;
      a level restorer, coupled to an output of the forward path portion, that is configured to convert the first signal to a second signal having a level-restored amplitude that can be a value that is either greater or less than the variable amplitude of the first signal; and
      a feedback path, coupled between the level restorer and a second input of the forward path portion, that is configured to return the second signal to the forward path portion;
   a clock distribution unit, coupled to the level-restored clock generator, that is configured to generate a distributed clock signal based on the second signal; and
   a plurality of processors, coupled to the clock distribution unit, that are configured to perform digital operations in synchrony with the distributed clock signal.

3. The synchronous system of claim 2, wherein the variable amplitude of the first signal and the level-restored amplitude of the second signal correspond to a level-restorer input voltage and a level-restorer output voltage, respectively.

4. The synchronous system of claim 3, further comprising a supply-regulated voltage controlled oscillator.

5. The synchronous system of claim 4, wherein the processors are at least one of a microprocessor, an arithmetic-logic unit, and an application specific integrated circuit.

6. The synchronous system of claim 2, wherein the feedback path includes a divide-by-N circuit that divides the first frequency by a predetermined frequency divisor to generate a returned second signal having a second frequency that equals the first frequency divided by the predetermined frequency divisor.

7. The synchronous system of claim 2, wherein synchrony includes operating at at least one of the first frequency and a second frequency that equals the first frequency divided by a predetermined frequency divisor.

8. A phase locked loop device, comprising:
   a forward path portion that receives an input clock signal at an input, the forward path portion outputting a first signal having a variable amplitude and a first frequency;
   a level restorer, coupled to an output of the forward path portion, that is configured to convert the first signal to a second signal having a level-restored amplitude with a value that can be either greater or less than the variable amplitude of the first signal; and
   a feedback path, coupled between the level restorer and the input of the forward path portion.

9. The phase locked loop device of claim 8, wherein the variable amplitude of the first signal and the level-restored amplitude of the second signal are a level-restorer input voltage and a level-restorer output voltage, respectively.

10. The phase locked loop device of claim 9, wherein the level restorer further comprises:
a capacitor that is configured to block a DC portion of the first signal;
an inverting amplifier, coupled to the capacitor, that is configured to generate the second signal; and
a feedback element, coupled to the inverting amplifier, that is configured to bias the inverting amplifier at a point of maximum gain.

11. The phase locked loop device of claim 10, wherein the capacitor is a coupling capacitor.

12. The phase locked loop device of claim 10, wherein the capacitor, the inverting amplifier, and the feedback element are MOSFETs.

13. The phase locked loop device of claim 10, wherein the first and second signals are differential signals.

14. The phase locked loop device of claim 8, wherein each of the first and the second signals are differential signals and the level restorer further comprises:
a first and a second capacitor that are configured to block a DC portion of the first signal;
a differential-input differential-output amplifier, coupled to the first and second capacitors, the differential-input-differential-output amplifier having a non-inverting input, an inverting input, a non-inverted output, and an inverted output, and being configured to generate a second differential signal having a level-restored amplitude and the first frequency; and
a first and a second feedback element, coupled to the differential-input differential-output amplifier, that are configured to bias the non-inverting input and the inverting input to respective points of maximum gain, the first feedback element coupling the inverted output to the non-inverting input, and the second feedback element coupling the non-inverted output to the inverting input.

15. The phase locked loop device of claim 14, wherein the first and the second capacitors are coupling capacitors.

16. The phase locked loop device of claim 8, wherein the level restorer further comprises:
a capacitor that is configured to block a DC portion of the first signal;
a first bias resistor, coupled to the capacitor, that is configured to supply a positive bias voltage to the capacitor;
a second bias resistor, coupled to the first bias resistor, that is configured to divide the bias voltage to generate a threshold voltage that is added to the DC-blocked first signal; and
an inverting amplifier, coupled to the capacitor, that is configured to invert the DC-blocked first signal, generate the second signal, and couple the second signal to the feedback path.

17. The phase locked loop device of claim 14, wherein the capacitor is a coupling capacitor.

18. The phase locked loop device of claim 8, wherein the forward path portion further comprises:
a phase-frequency detector that receives the input clock signal and a feedback signal from the feedback path and generates a digital phase error signal;
a charge pump, coupled to the phase-frequency detector, that is configured to convert the digital phase error signal to an analog phase-error signal;
a loop filter, coupled to the charge pump, that is configured to shape a spectrum of the analog phase-error signal; and
a supply-regulated voltage controlled oscillator, coupled to the loop filter, that is configured to generate the first signal based on the spectrally shaped analog phase error signal.

19. The phase locked loop device of claim 18, wherein the first frequency varies monotonically as a function of the spectrally shaped analog phase-error signal.

20. The phase locked loop device of claim 19, wherein the first signal amplitude varies monotonically as a function of the first frequency.

21. The phase locked loop device of claim 18, wherein the forward path portion further comprises:
a voltage regulator, coupled to the loop filter, that is configured to generate a regulated power supply voltage in response to the spectrally-shaped analog phase error signal and couple the regulated power supply voltage to the supply-regulated voltage controlled oscillator.

22. The phase locked loop device of claim 8, wherein the feedback path further comprises:
a divider circuit that is configured to divide the first frequency by one of N and N+1, where N is an integer.

23. The phase locked loop device of claim 22, wherein the divider circuit toggles between N and N+1 to generate a feedback signal having an input frequency and a sidelobe amplitude.

24. The phase locked loop device of claim 23, further comprising:
a phase modulator, coupled to the divider circuit that is configured to inject a phase compensation signal into a phase-frequency detector to reduce the sidelobe amplitude.

25. The phase locked loop device of claim 8, further comprising:
an output buffer, coupled to the level restorer, that is configured to generate a clock output signal with greater power transfer than the level restorer.

26. A method of synthesizing a digital clock signal, comprising:
receiving an input clock signal at an input of a forward path portion of a phase locked loop;
generating a first differential signal having a variable amplitude and a first frequency from the input clock signal; and
converting the first differential signal to a second differential signal having a level-restored amplitude that can be either greater or less than the variable amplitude.

27. The method of claim 26, further comprising:
coupling the second differential signal to the input of the forward path portion.

28. The method of claim 26, wherein converting the first differential signal to the second differential signal having the level-restored amplitude and the first frequency further comprises:
blocking a DC portion of the first differential signal;
biasing an amplifier to a point of maximum gain; and
generating the second differential signal having the level-restored amplitude and the first frequency by saturating the amplifier.

29. The method of claim 26, wherein converting the first differential signal to the second differential signal having the level-restored amplitude and the first frequency further comprises:
blocking a DC portion of the first differential signal;
supplying a bias voltage to an amplifier;
dividing the bias voltage to generate a threshold voltage of the amplifier, saturating the amplifier to generate a level-restored-amplitude second signal; and coupling the level-restored-amplitude second signal to a feedback path.

30. The method of claim 27, wherein receiving an input clock signal at an input of a forward path portion of a phase locked loop further comprises:

receiving the input clock signal and a feedback signal;

generating a digital phase error signal from the input clock and feedback signals;

converting the digital phase error signal to an analog phase-error signal; and shaping the spectrum of the analog phase-error signal using a loop filter.

31. The method of claim 30, wherein the first frequency varies monotonically as a function of the spectrally shaped analog phase-error signal.

32. The method of claim 31, wherein the first differential signal amplitude varies monotonically as a function of the first frequency.

33. The method of claim 32, further comprising:

generating a regulated power supply voltage in response to the spectrally shaped analog phase-error signal; and coupling the regulated power supply voltage to a supply-regulated voltage controlled oscillator to generate the first differential signal.

34. The method of claim 27, further comprising:

dividing the first frequency by one of N and N+1, where N is an integer.

35. The method of claim 34, wherein the first frequency is alternately divided by N and N+1.

36. The method of claim 35, further comprising:

injecting a phase compensation signal into a phase-frequency detector to reduce a sidelobe amplitude of the analog phase-error signal.

37. The method of claim 27, further comprising:

buffering the second differential signal to increase a power transfer between a level restorer and a plurality of clock receiving circuits.

38. A processor, comprising:

a clock source that is configured to generate an input clock signal having an input frequency;

a forward path portion that is configured to receive the input clock signal at a first input and generate a first signal having a variable amplitude and a first frequency, the forward path portion including a supply-regulated voltage controlled oscillator, the first signal being based on the input clock signal; and a level restorer, coupled to an output of the forward path portion, that is configured to convert the first signal to a second signal having the first frequency and a level-restored amplitude that can be a value that is either greater or less than the variable amplitude of the first signal, wherein the variable amplitude of the first signal and the level-restored amplitude of the second signal correspond to a level-restorer input voltage and a level-restorer output voltage, respectively.

* * * * *

UNITED STATES PATENT AND TRADEMARK OFFICE
CERTIFICATE OF CORRECTION

| | | |
|---|---|---|
| PATENT NO. | : 7,804,341 B2 | Page 1 of 1 |
| APPLICATION NO. | : 12/061373 | |
| DATED | : September 28, 2010 | |
| INVENTOR(S) | : Mel Bazes | |

It is certified that error appears in the above-identified patent and that said Letters Patent is hereby corrected as shown below:

On the Title Page, Item [54] and Column 1, line 1, Title:

"LEVEL-RESTORED FOR SUPPLY-REGULATED PLL", should read -- LEVEL-RESTORER FOR SUPPLY-REGULATED PLL --

Signed and Sealed this

Sixteenth Day of August, 2011

David J. Kappos
*Director of the United States Patent and Trademark Office*